(12) United States Patent
Chu et al.

(10) Patent No.: US 11,085,960 B2
(45) Date of Patent: Aug. 10, 2021

(54) INSULATION DETECTION METHOD

(71) Applicant: CONTEMPORARY AMPEREX TECHNOLOGY CO., LIMITED, Ningde (CN)

(72) Inventors: Le Chu, Ningde (CN); Qiandeng Li, Ningde (CN); Yanhui Fu, Ningde (CN); Qidong Lou, Ningde (CN)

(73) Assignee: CONTEMPORARY AMPEREX TECHNOLOGY CO., LIMITED, Ningde (CN)

( * ) Notice: Subject to any disclaimer, the term of this patent is extended or adjusted under 35 U.S.C. 154(b) by 152 days.

(21) Appl. No.: 16/364,390

(22) Filed: Mar. 26, 2019

(65) Prior Publication Data

US 2020/0072896 A1 Mar. 5, 2020

(30) Foreign Application Priority Data

Aug. 31, 2018 (CN) .......................... 201811013014.1

(51) Int. Cl.
*G01R 31/50* (2020.01)
*G01R 31/14* (2006.01)
(Continued)

(52) U.S. Cl.
CPC ............. *G01R 31/14* (2013.01); *G01R 27/14* (2013.01); *G01R 31/389* (2019.01); *G01R 31/3835* (2019.01); *G01R 31/50* (2020.01)

(58) Field of Classification Search
CPC ...... G01R 27/025; G01R 27/14; G01R 31/14; G01R 31/3835; G01R 31/389;
(Continued)

(56) References Cited

U.S. PATENT DOCUMENTS

2013/0027049 A1* 1/2013 Sukup .................. G01R 31/382
324/430
2017/0016951 A1 1/2017 Sung et al.
(Continued)

FOREIGN PATENT DOCUMENTS

CN 202230137 U * 5/2012 ............. G01R 27/14
CN 202230137 U 5/2012
(Continued)

OTHER PUBLICATIONS

Espacenet translate CN202230137U Power cell insulation detection system for electric automobile (Year: 2011).*
(Continued)

*Primary Examiner* — Melissa J Koval
*Assistant Examiner* — Courtney G McDonnough
(74) *Attorney, Agent, or Firm* — Heslin Rothenberg Farley & Mesiti P.C

(57) ABSTRACT

An insulation detection method includes: a first and second equivalent resistances are calculated; the less one of the first and second equivalent resistances is taken as a first insulation resistance, which is an insulation resistance of the high voltage circuit on the side where the battery pack locates relative to the reference potential terminal; when the first insulation resistance is normal, the switch unit is closed, and a second insulation resistance is calculated according to the first and second equivalent resistances, voltages of a first and second sampling point when the switch unit is closed; the second insulation resistance is an insulation resistance of the high voltage circuit on the side where the load locates relative to the reference potential terminal; the insulation state of the high voltage circuit on the side where the load locates is determined according to the second insulation resistance.

8 Claims, 6 Drawing Sheets

(51) Int. Cl.
  *G01R 31/389* (2019.01)
  *G01R 31/3835* (2019.01)
  *G01R 27/14* (2006.01)

(58) Field of Classification Search
  CPC .... G01R 31/50; H01M 10/425; H01M 10/48;
              H01M 2200/00; Y02E 60/10
  USPC .................................................. 324/551, 430
  See application file for complete search history.

(56) References Cited

U.S. PATENT DOCUMENTS

| | | | | |
|---|---|---|---|---|
| 2019/0011504 | A1* | 1/2019 | Kim | G01R 27/025 |
| 2019/0242933 | A1* | 8/2019 | Sung | H01M 10/482 |

FOREIGN PATENT DOCUMENTS

| | | | |
|---|---|---|---|
| CN | 103048545 | A | 4/2013 |
| CN | 203720299 | U | 7/2014 |
| CN | 106646170 | A | 5/2017 |
| CN | 107490750 | A | 12/2017 |
| CN | 107526041 | A | 12/2017 |
| CN | 207164146 | U | 3/2018 |
| CN | 207181530 | U | 4/2018 |
| CN | 207424209 | U | 5/2018 |
| CN | 108099609 | A | 6/2018 |
| CN | 108333428 | A | 7/2018 |
| EP | 3451005 | A2 | 3/2019 |
| GB | 2499514 | A | 8/2013 |
| KR | 101619328 | B1 | 5/2016 |
| KR | 20160146350 | A | 12/2016 |
| WO | 2018139830 | A1 | 8/2018 |

OTHER PUBLICATIONS

Search Report for Chinese Patent Application No. 201811013014.1 dated Sep. 22, 2020.
Extended European Search Report for European Application No. 19165186.8 dated Oct. 31, 2019.
Search Report for Chinese Patent Application No. 201811013014.1 dated Mar. 1, 2021.

* cited by examiner

INSULATION DETECTION METHOD

CROSS REFERENCE TO RELATED APPLICATIONS

The present application claims priority to Chinese Patent Application Serial No. 201811013014.1 filed on Aug. 31, 2018 and entitled "INSULATION DETECTION METHOD", the disclosure of which is incorporated herein by reference in its entirety.

TECHNICAL FIELD

The present disclosure relates to battery technologies, and in particular, to an insulation detection method.

BACKGROUND

It has become a trend in the automotive industry that fuel vehicles are being replaced by electric vehicles. As a power battery pack being one of the key parts of an electric vehicle, safety of high voltage power of the power battery pack is one of the primary concerns in an entire power battery system. Therefore, it is an essential part of high-voltage circuit design to detect insulativity of the high-voltage circuit of the battery pack.

SUMMARY

Some embodiments of the present disclosure provides an insulation detection method that based on an insulation resistance detection circuit, the circuit including: a battery pack, a switch unit, and a load, both terminals of the load connecting to a positive electrode and a negative electrode of the battery pack respectively through the switch unit; wherein the battery pack and the load respectively locate on different sides of the switch unit; the circuit further includes a controller, a first sampling point, and a second sampling point, the first sampling point is a connection point between the positive electrode of the battery pack and the switch unit, the second sampling point is a connection point between the switch unit and the negative electrode of the battery pack, and the controller respectively connects the first sampling point and the second sampling point. The method includes: a first equivalent resistance and a second equivalent resistance are calculated; the first equivalent resistance is an equivalent resistance of the positive electrode of the battery pack relative to a reference potential terminal, and the second equivalent resistance is an equivalent resistance of the negative electrode of the battery pack relative to the reference potential terminal; the less one of the first equivalent resistance and the second equivalent resistance is taken as a first insulation resistance; the first insulation resistance is an insulation resistance of a high voltage circuit on a side where the battery pack locates relative to the reference potential terminal; when the first insulation resistance is normal, the switch unit is closed, and a second insulation resistance is calculated according to the first equivalent resistance, the second equivalent resistance, a voltage of the first sampling point and a voltage of the second sampling point when the switch unit is closed; the second insulation resistance is an insulation resistance of a high voltage circuit on a side where the load locates relative to the reference potential terminal; an insulation state of the high voltage circuit on the side where the load locates is determined according to the second insulation resistance.

Herein, the term of insulation detection method means that a method for detecting and calculating insulation resistances, and further determining the insulation state of the circuit.

In an example, the switch unit includes a plurality of switches that include a main positive switch connecting between the positive electrode of the battery pack and the load, and a main negative switch connecting between the load and the negative electrode of the battery pack. The step that the switch unit is closed, and the second insulation resistance is calculated according to the first equivalent resistance, the second equivalent resistance, and the voltage of the first sampling point and the voltage of the second sampling point when the switch unit is closed, specifically includes: any one of the plurality of switches is closed, and the second insulation resistance is calculated according to the first equivalent resistance, the second equivalent resistance, and the voltage of the first sampling point and the voltage of the second sampling point when the switch is closed.

In an example, the switch unit includes the plurality of switches that include a main positive switch connecting between the positive electrode of the battery pack and the load, and a main negative switch connecting between the load and the negative electrode of the battery pack. The step that the switch unit is closed, and the second insulation resistance is calculated according to the first equivalent resistance, the second equivalent resistance, and the voltage of the first sampling point and the voltage of the second sampling point when the switch unit is closed, specifically includes: one of the plurality of switches is selected to be closed, and a current corresponding third equivalent resistance is calculated according to the first equivalent resistance, the second equivalent resistance, and the voltage of the first sampling point and the voltage of the second sampling point when the switch is closed. The third equivalent resistance is an equivalent resistance of the high voltage circuit on the side where the load locates relative to the reference potential terminal. The currently closed switch is disconnected, another one of the plurality of switches is reselected to be closed, and the currently corresponding third equivalent resistance is recalculated until the number of the selected switches reaches a preset value which is greater than 1. A fourth equivalent resistance and a fifth equivalent resistance are calculated according to the third equivalent resistances, the fourth equivalent resistance is an equivalent resistance of the first terminal of the load relative to the reference potential terminal, and the fifth equivalent resistance is an equivalent resistance of the second terminal of the load relative to the reference potential terminal. The first terminal of the load is the terminal connecting to the positive electrode of the battery pack, and the second terminal of the load is the terminal connecting to the negative electrode of the battery pack. The less one of the fourth equivalent resistance and the fifth equivalent resistance is taken as the second insulation resistance.

In an example, the plurality of switches may further include a pre-charge switch connecting in series with a pre-charge resistance, and the pre-charge switch and the pre-charge resistance connect together between two terminals of the main positive switch.

In an example, the circuit further includes a control switch unit and a reference resistance unit on the same side as where the battery pack locates. The reference resistance unit connects in series with the control switch unit, and the reference resistance unit and the control switch unit connect together between the positive and negative electrodes of the battery pack. The step that the first equivalent resistance and the second equivalent resistance are calculated, specifically includes: the voltage of the first sampling point and the voltage of the second sampling point are sampled in a state where the switch unit and the control switch unit are disconnected; the control switch unit is further closed and the voltage of the first sampling point and the voltage of the second sampling point are resampled; the first equivalent resistance and the second equivalent resistance are calculated according to the voltages of the first sampling point, the voltages of the second sampling point at two times, and the reference resistance unit in the circuit when the control switch unit is closed.

In an example, the control switch unit includes a first control switch module and a second control switch module, and the reference resistance unit includes a first reference resistance module and a second reference resistance module. The first reference resistance module connects the first switch module to form a first branch, and the second reference resistance module connects the second control switch module to form a second branch. One terminal of the first branch connects one terminal of the second branch, and they connect together to the reference potential terminal. The other terminal of the first branch connects the positive electrode of the battery pack, and the other terminal of the second branch connects the negative electrode of the battery pack. The step that the control switch unit is closed specifically includes: the first control switch module is closed, if the sampled voltage of the first sampling point is greater than or equal to the sampled voltage of the second sampling point, in a state where the switch unit and the control switch unit are disconnected; the second control switch module is closed, if the sampled voltage of the first sampling point is less than the sampled voltage of the second sampling point, in a state where the switch unit and the control switch unit are disconnected.

In an example, the step that the insulation state of the high voltage circuit on the side where the load locates is determined according to the second insulation resistance, specifically includes: determine whether the second insulation resistance is less than an external preset threshold; if yes, it is determined that the insulativity of the high voltage circuit on the side where the load locates fails to meet standards; if no, it is determined that the insulativity of the high voltage circuit on the side where the load locates meets the standards.

In an example, the insulation detection method further includes: when it is determined that the insulativity of the high voltage circuit on the side where the load locates fails to meet the standards, an insulation alert is transmitted.

BRIEF DESCRIPTION OF THE DRAWINGS

One or more embodiments are described as examples with reference to the corresponding figures in the accompanying drawings, and the examples do not constitute a limitation to the embodiments. Elements with the same reference numerals in the accompanying drawings represent similar elements. The figures in the accompanying drawings do not constitute a proportion limitation unless otherwise stated.

DETAILED DESCRIPTION

In order to further clarify the objective, technical solutions and advantages of embodiments of the present disclosure, the embodiments of the present disclosure will be described in detail below with reference to the accompanying drawings. However, it will be apparent to those skilled in the art that, in the various embodiments of the present disclosure, technical details are set forth in order to provide a better understanding of the present disclosure. However, the technical solutions claimed in the present disclosure may be implemented without these technical details and various changes and modifications based on the following embodiments.

The inventors find that, a conventional insulation detection scheme can only detect an insulation state inside a switch unit (i.e., the high voltage circuit on the side where the battery pack locates), but is not concerned about the insulation state outside the switch unit (i.e., the high voltage circuit on the side where the load locates). Consequently, when an insulation fault occurs to the outside of the switch unit, it is very dangerous.

In view of the above, some embodiments of the present disclosure provide an insulation detection method, which may detect insulation state of a high voltage circuit on a side where a battery pack locates, and may detect insulation state of a high voltage circuit on a side where a load locates, so as to avoid insulation fault caused by failed insulativity of the high voltage circuit on the side where the load locates.

Figure 1:
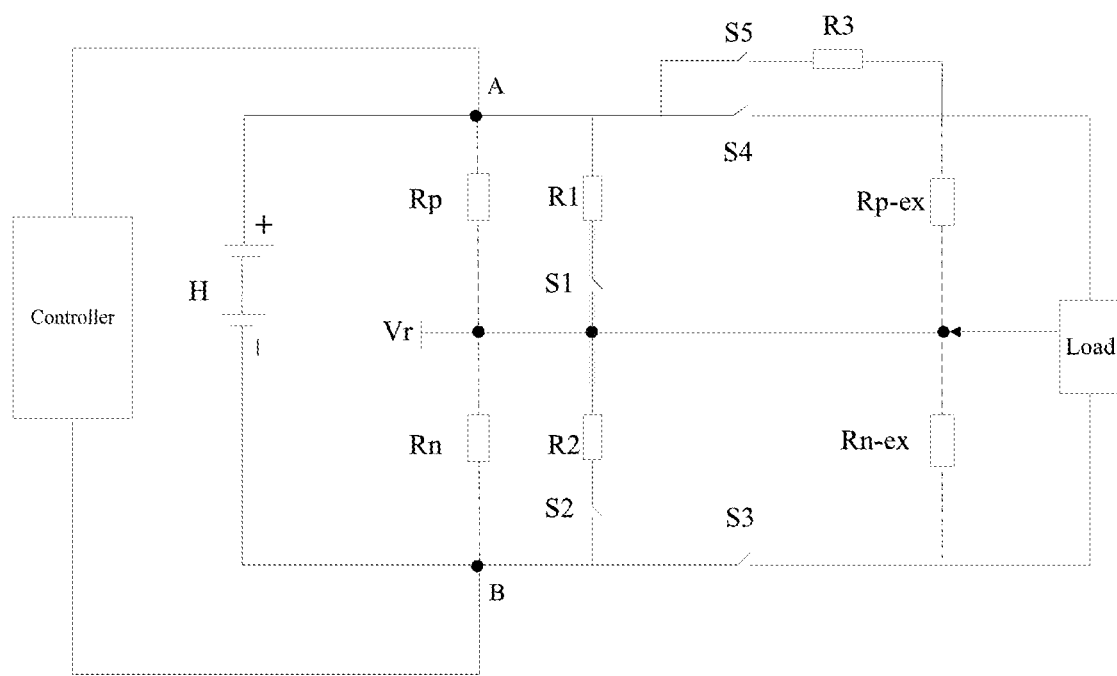
FIG. 1 is a schematic structural view of an exemplary insulation resistance detection circuit according to a first embodiment of the present disclosure.

A first embodiment of the present disclosure relates to an insulation detection method which is based on an insulation resistance detection circuit as shown in FIG. 1. The circuit includes a battery pack H, a switch unit and a load, wherein both terminals of the load connect the positive and negative electrodes of the battery pack H through the switch unit respectively. The battery pack H and the load are located on different sides of the switch unit. The circuit further includes a controller, a first sampling point A and a second sampling point B. The first sampling point A is a connection point between a positive electrode of the battery pack and the switch unit, the second sampling point B is a connection point between the switch unit and a negative electrode of the battery pack, and the controller respectively connects the first sampling point A and the second sampling point B to sample voltages of the first sampling point A and the second sampling point B. It is worth mentioning that in practice, the controller may connect the first sampling point A and the second sampling point B through a sampling unit, and may sample the voltages of the first sampling point A and the second sampling point B through the sampling unit, which is not limited in this embodiment.

Specifically, in this embodiment, the switch unit may include a plurality of switches that may include a main negative switch S3 and a main positive switch S4, wherein the main positive switch S4 connects between the positive electrode of the battery pack and the load, and the main negative switch S3 connects between the load and the negative electrode of the battery pack. As an example, the plurality of switches may further include a pre-charge switch S5 connected in series with a pre-charge resistance R3, and S5 and R3 connect together between the two terminals of the main positive switch S4. In practice, the main negative switch S3, the main positive switch S4 and the pre-charge switch S5 may be a contactor, a relay or an IGBT, etc. The main negative switch S3, the main positive switch S4 or the pre-charge switch S5 may be formed by a single contactor (or relay or IGBT), and may also be composed of a plurality of contactors (or relays or IGBTs), which is not limited in this embodiment.

The insulation resistance detection circuit further includes a control switch unit and a reference resistance unit that connect in series, and connect together between the positive and negative electrodes of the battery pack H. Specifically, the control switch unit includes a first control switch module S1 and a second control switch module S2, and the reference resistance unit includes a first reference resistance module R1 and a second reference resistance module R2. R1 and S1 connect together to form a first branch, and R2 and S2 connect together to form a second branch. One terminal of the first branch connects one terminal of the second branch, and they together connect a reference potential terminal Vr (the reference potential terminal may be ground of the whole vehicle, but is not limited thereto, and the reference potential terminal may be flexibly selected according to actual needs in practice). The other terminal of the first branch connects to the positive electrode of the battery pack H, while the other terminal of the second branch connects the negative electrode of the battery pack H. In practice, the first control switch module S1 and the second control switch module S2 may be formed by one or more switches, which is not limited in this embodiment.

Figure 2:
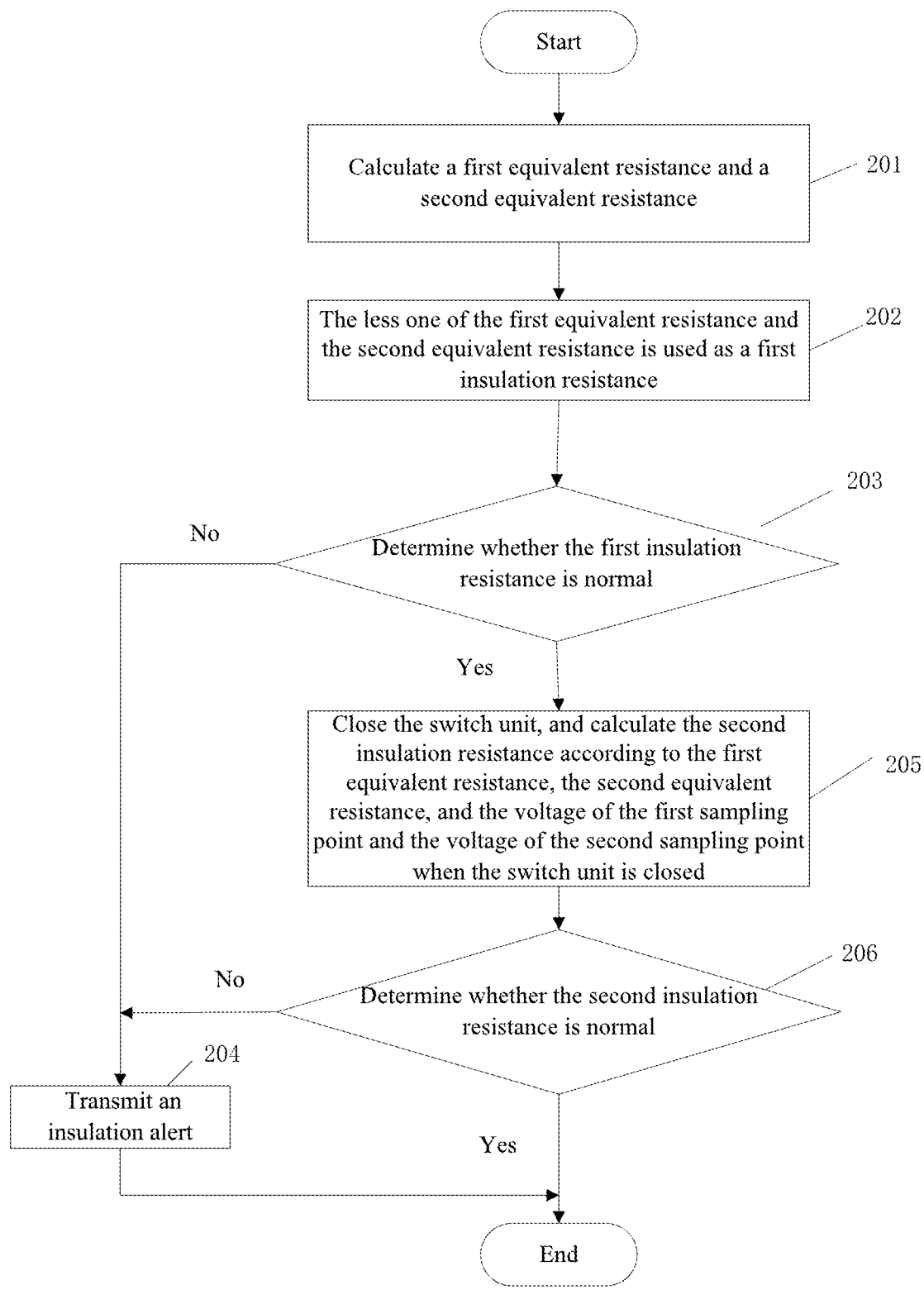
FIG. 2 is a flow chart of an exemplary insulation detection method according to the first embodiment of the present disclosure.

The insulation detection method provided by this embodiment may detect insulativity of a high voltage circuit on a side where the battery pack locates, and may detect insulativity of a high voltage circuit on a side where the load locates, specific process of which is shown in FIG. 2.

Step 201: Calculate a first equivalent resistance and a second equivalent resistance.

A first equivalent resistance Rp is an equivalent resistance of the positive electrode of the battery pack H relative to the reference potential terminal Vr, and a second equivalent resistance Rn is an equivalent resistance of the negative electrode of the battery pack H relative to the reference potential terminal Vr.

Figure 3:
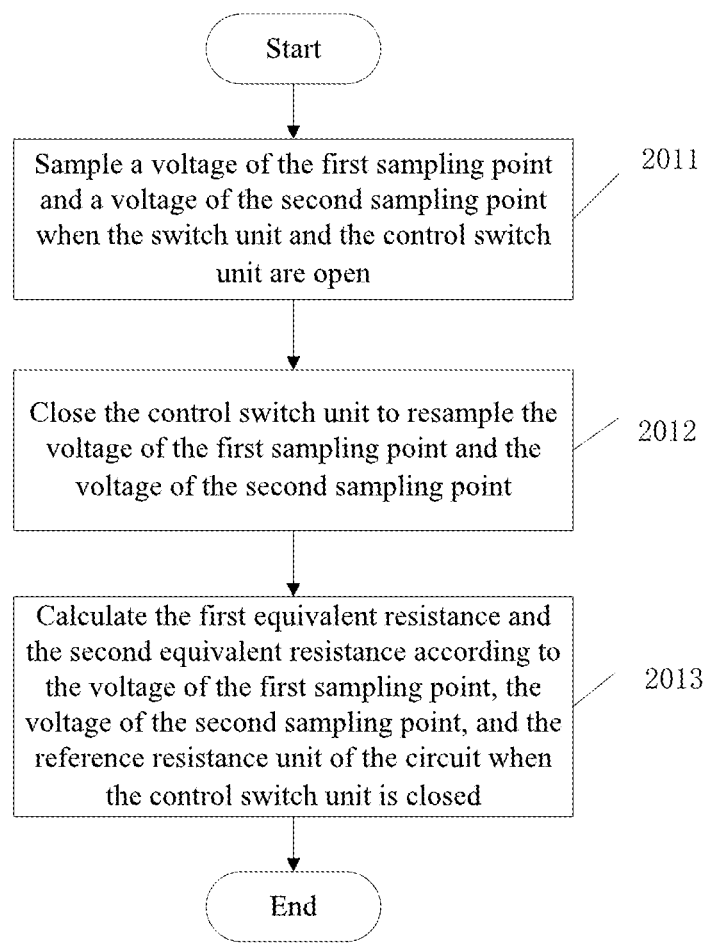
FIG. 3 is a flow chart for calculating a first equivalent resistance and a second equivalent resistance according to the first embodiment of the present disclosure.

This step may be implemented via the following substeps, as shown in FIG. 3.

Step 2011: Sample a voltage of the first sampling point and a voltage of the second sampling point when the switch unit and the control switch unit are open.

That is, the controller samples a voltage value V1 of the first sampling point A and a voltage value V2 of the second sampling point B when the first control switch module S1, the second control switch module S2, the main negative switch S3, the main positive switch S4, and the pre-charge switch S5 are all open. At this time, V1 and V2 satisfy the following equation:

$$\frac{V1}{Rp} = \frac{V2}{Rn} \qquad (1)$$

Step 2012: Close the control switch unit to resample the voltage of the first sampling point and the voltage of the second sampling point.

Specifically, after the controller samples the voltage value V1 of the first sampling point A and the voltage value V2 of the second sampling point B for the first time, V1 and V2 may be compared first. Take V1≥V2 as an example, at this time, Rp≥Rn. If the second control switch module S2 is closed, the second equivalent resistance Rn connects the second reference resistance module R2 in parallel, and the resistance of the parallel Rn and R2 is less than the second equivalent resistance Rn. The current in the circuit may become greater, thereby increasing danger between the high voltage and the reference potential terminal Vr. Therefore, in this step, the first control switch module S1 may be closed, so that the first equivalent resistance Rp connects the first reference resistance module R1 in parallel to reduce the danger. After the first control switch module S1 is closed, the voltage value V1' of the first sampling point A and the voltage value V2' of the second sampling point B may be resampled. At this time, V1' and V2' satisfy the following equation:

$$\frac{V1'}{\frac{Rp \cdot R1}{Rp + R1}} = \frac{V2'}{Rn} \qquad (2)$$

Step 2013: Calculate the first equivalent resistance and the second equivalent resistance according to the two voltages of the first sampling point, the two voltages of the second sampling point, and the reference resistance unit of the circuit when the control switch unit is closed.

In the above example, after obtaining V1, V2, V1', V2' and the first reference resistance R1, the first equivalent resistance Rp and the second equivalent Resistance Rn may be calculated according to the above equations (1) and (2).

It is worth mentioning that the above description takes V1≥V2 as an example. Similarly, if V1<V2, it may be selected that the second control switch module S2 is closed, so that the second equivalent resistance Rn connects the second reference resistance module in parallel. The principle thereof is similar to the above, so this embodiment will not be described in detail. In addition, when V1=V2, the first control switch module S1 may be closed, or the second control switch module S2 may be closed.

In addition, the first reference resistance module R1 may be made greater than the first equivalent resistance Rp by at least one order of magnitude, so that the resistance value after R1 and Rp connect in parallel is closer to Rp, thereby reducing effect of R1 on the voltage of Rp. Similarly, the second reference resistance module R2 may be made greater than the second equivalent resistance Rn by at least one order of magnitude.

Step 202: The less one of the first equivalent resistance and the second equivalent resistance is used as a first insulation resistance.

The first insulation resistance is the insulation resistance of the high voltage circuit on the side where the battery pack locates relative to the reference potential terminal Vr. The less the first equivalent resistance Rp and the second equivalent resistance Rn are, the greater the current is, and the easier it is to cause an insulation fault between the high voltage and the reference potential terminal Vr. Therefore, after the first equivalent resistance Rp and the second equivalent resistance Rn are obtained, the less one of the first equivalent resistance Rp and the second equivalent resistance Rn may be selected as the first insulation resistance to evaluate the insulativity of the high voltage circuit on the side where the battery pack locates.

Step 203: Determine whether the first insulation resistance is normal. If not, proceed to step 204; if it is normal, proceed to step 205.

In this step, the calculated first insulation resistance may be compared with an internal preset threshold (i.e., an insulation resistance value within a safe range of the high voltage circuit on the side where the battery pack locates). If the first insulation resistance is less than the internal preset threshold, it would indicate that the insulativity of the high voltage circuit on the side where the battery pack locates fails to meet the standards, and it may be determined that the first insulation resistance is abnormal. If the first insulation resistance is not less than the internal preset threshold, it would indicate that the insulativity of the high voltage circuit on the side where the battery pack locates meets the standards, at this time, the first insulation resistance may be determined to be normal.

Step 204: Transmit an insulation alert.

Step 205: Close the switch unit, and calculate the second insulation resistance according to the first equivalent resistance, the second equivalent resistance, and the voltage of the first sampling point and the voltage of the second sampling point when the switch unit is closed.

The second insulation resistance is the insulation resistance of the high voltage circuit on the side where the load locates relative to the reference potential terminal Vr.

Figure 4:
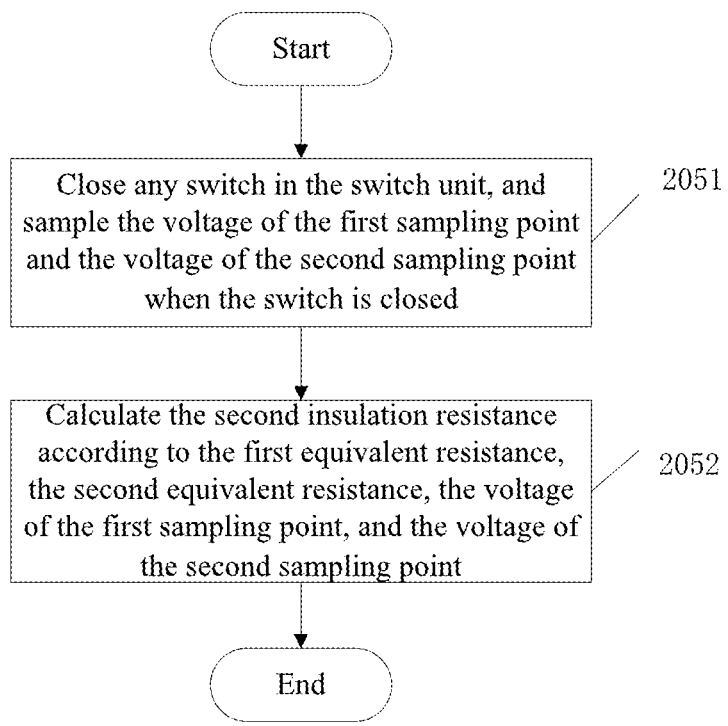
FIG. 4 is a flow chart for calculating a second insulation resistance according to the first embodiment of the present disclosure.

The present step is implemented via the following sub-step, as shown in FIG. 4.

Step 2051: Close any switch in the switch unit, and sample the voltage of the first sampling point and the voltage of the second sampling point when the switch is closed.

Specifically, when the switch unit includes the main negative switch S3 and the main positive switch S4, either one of the main negative switch S3 and the main positive switch S4 may be closed. When the switch unit further includes the pre-charge switch S5, any one of the main negative switch S3, the main positive switch S4, and the pre-charge switch S5 may be selected to be closed.

Figure 5:
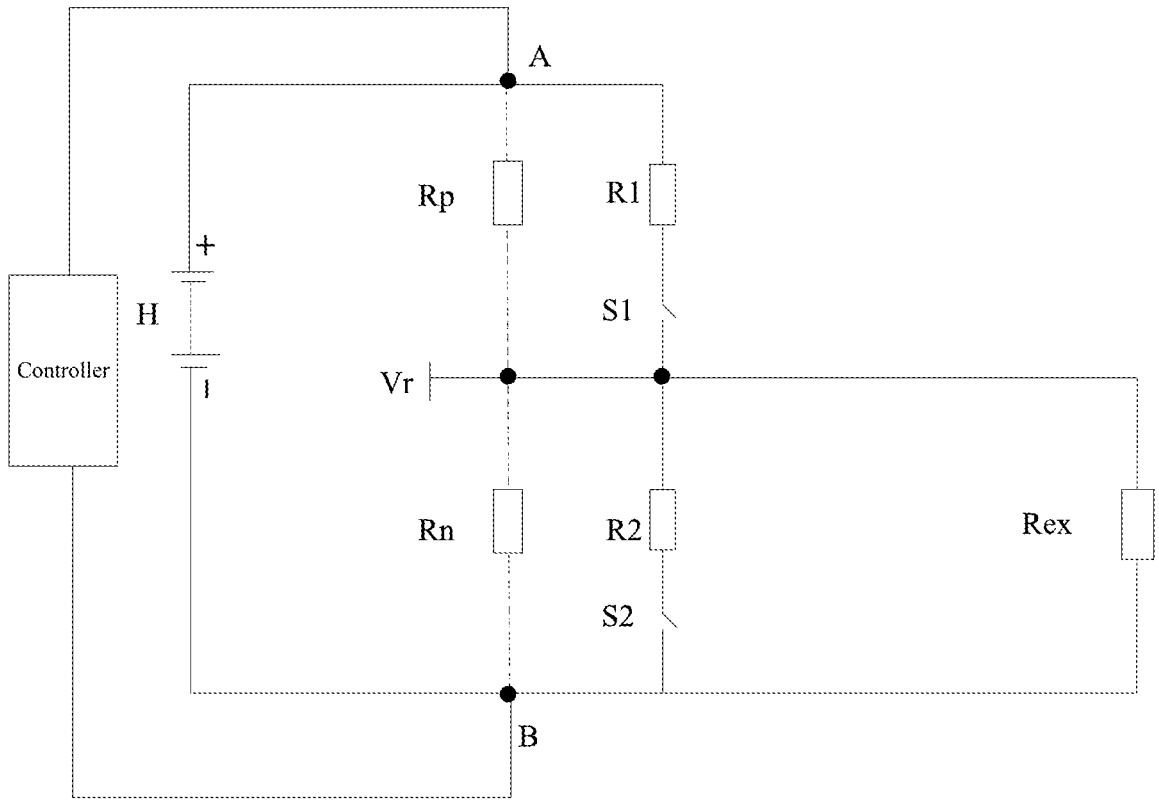
FIG. 5 is an equivalent circuit diagram of an exemplary insulation resistance detection circuit when a main negative switch unit S3 is closed according to the first embodiment of the present disclosure.

For example, the main negative switch S3 is individually closed, with reference to FIG. 5, Rex is equivalent resistance of the high voltage circuit on the side where the load locates relative to the reference potential terminal Vr when the main negative switch S3 is closed. In this case, Rex=(RL+Rp−ex)//Rn−ex, wherein Rp−ex is an equivalent resistance of a load's high voltage terminal relative to the reference potential terminal Vr, Rn−ex is the equivalent resistance of a load's low voltage terminal relative to the reference potential terminal Vr, and RL is a resistance of the load.

After the main negative switch unit S3 is closed, a voltage value V1″ of the first sampling point A and a voltage value V2″ of the second sampling point B are sampled, which satisfies the following equation:

$$\frac{V1''}{Rp} = \frac{V2''}{\frac{Rn \cdot Rex}{Rn + Rex}} \quad (3)$$

Step 2052: Calculate the second insulation resistance according to the first equivalent resistance, the second equivalent resistance, the voltage of the first sampling point, and the voltage of the second sampling point.

Rex may be obtained from Rp, Rn, and V1″, V2″ according to the above equation (3). In the present embodiment, Rex may be used as the second insulation resistance to evaluate the insulation state of the high voltage circuit on the side where the load locates.

Figure 6:
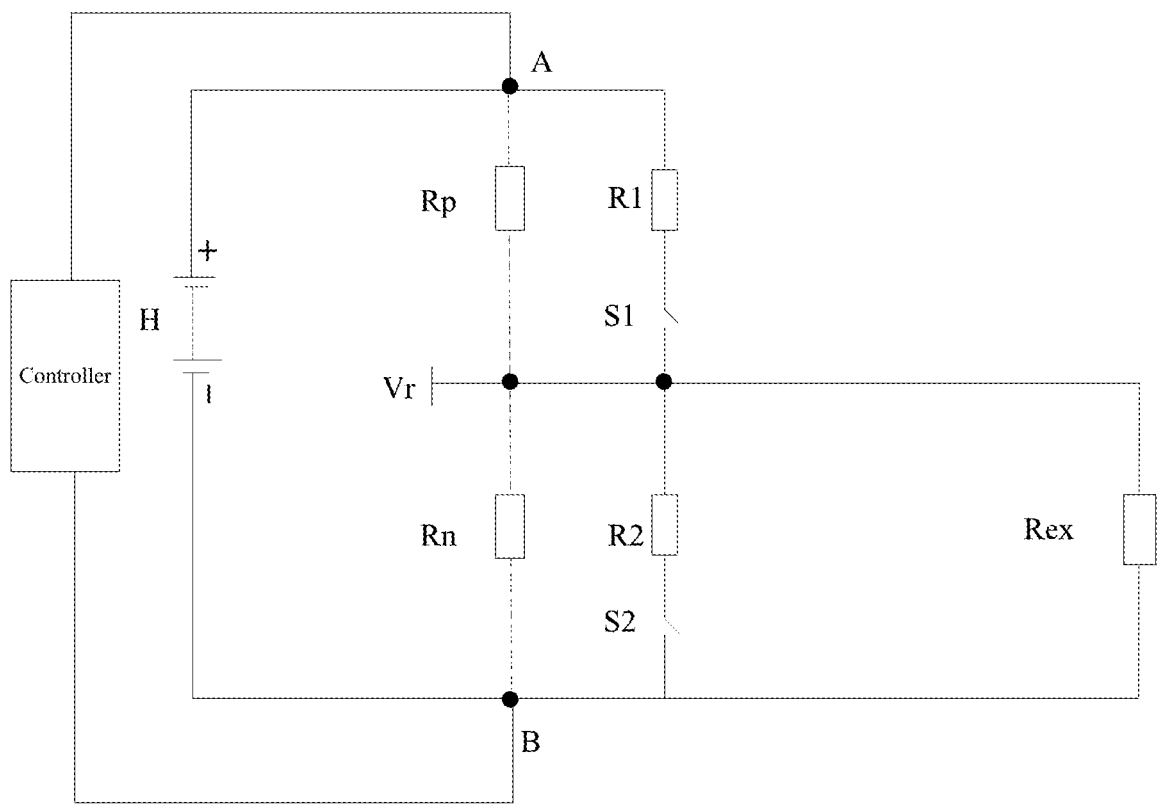
FIG. 6 is an equivalent circuit diagram of an exemplary insulation resistance detection circuit when a main positive switch unit S4 is closed according to the first embodiment of the present disclosure.

The above is described by taking the main negative switch S3 is closed as an example. FIG. 6 shows an equivalent circuit diagram when the main positive switch S4 is individually closed, wherein Rep is the equivalent resistance of the high voltage circuit on the side where the load locates relative to the reference potential terminal Vr when the main positive switch S4 is closed, and Rep=(RL+Rn−x)//Rp−x. When the main positive switch S4 is closed, it is assumed that the sampled first sampling point A has a voltage value of V1‴ and the second sampling point B has a voltage value of V2‴, which satisfies:

$$\frac{V1'''}{\frac{Rp \cdot Rep}{Rp + Rep}} = \frac{V2'''}{Rn} \quad (4)$$

According to the above equation (4), Rep may be obtained according to Rp, Rn, and V1‴, V2‴, and Rep may be used as the second insulation resistance to evaluate the insulation state of the high voltage circuit on the side where the load locates.

Figure 7:
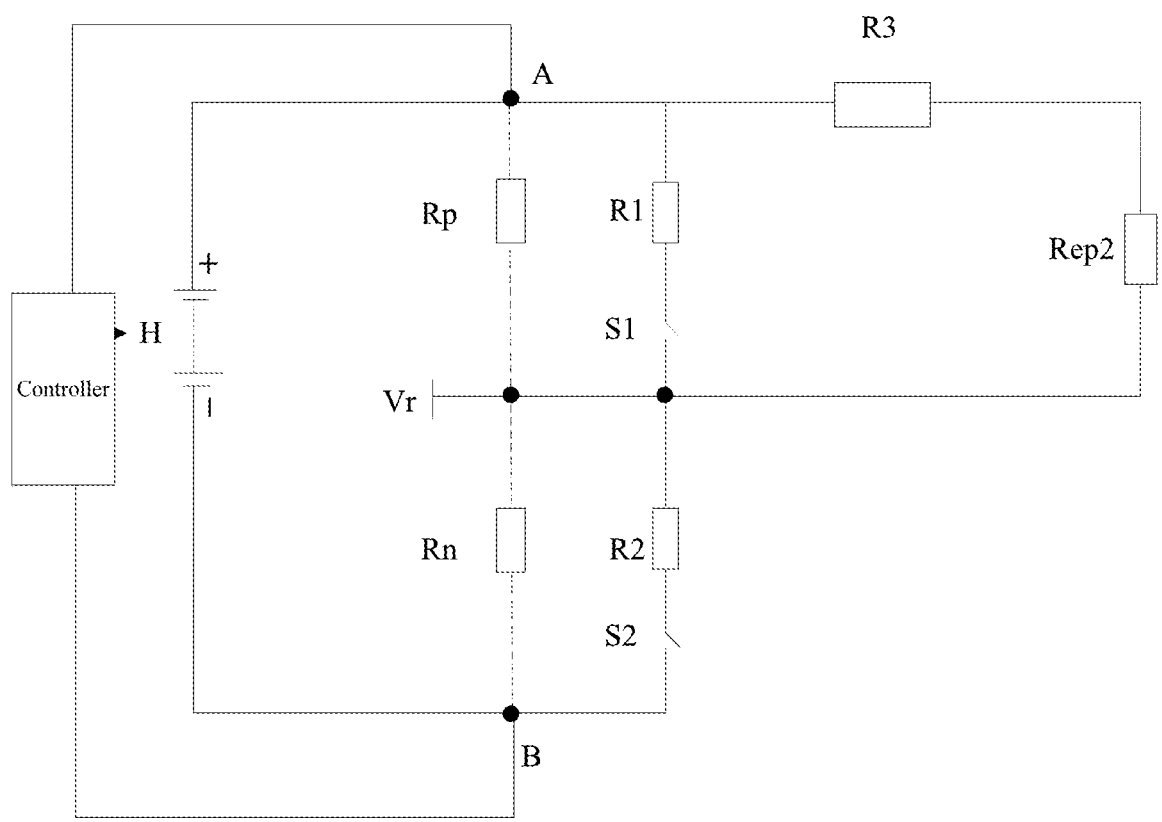
FIG. 7 is an equivalent circuit diagram of an exemplary insulation resistance detection circuit when a pre-charge switch unit S5 is closed according to the first embodiment of the present disclosure.

In practice, the pre-charge switch S5 may also be individually closed. FIG. 7 shows an equivalent circuit diagram when the pre-charge switch S5 is individually closed. Rep2 in the figure is the equivalent resistance of the high-voltage circuit on the side where the load locates relative to the reference potential terminal Vr when the pre-charge switch unit S5 is closed. The calculation process of Rep2 is similar to that of Rex and Rep, and will not be described in detail in this embodiment. Similarly, after Rep2 is calculated, Rep2 may be used as the second insulation resistance.

After the second insulation resistance is calculated, the insulation state of the high voltage circuit on the side where the load locates is determined according to the second insulation resistance, details of which may be seen in step 206.

Step 206: Determine if the second insulation resistance is normal. If it is normal, the process terminates; if not, the process proceeds to step 204.

Specifically, in this step, the second insulation resistance may be compared with an external preset threshold (i.e., the insulation resistance value within the safe range of the high voltage circuit on the side where the load locates) to determine whether the second insulation resistance is normal. If the second insulation resistance is less than the external preset threshold, it means that the insulativity of the high voltage circuit on the side where the load locates fails to meet the standards, and the second insulation resistance is determined to be abnormal. If the second insulation resistance is not less than the external preset threshold, it indicates that the insulativity of the high voltage circuit on the side where the load locates meets the standards, and the second insulation resistance may be determined to be normal. After the second insulation resistance is determined to be normal, related actions may be performed on the driver.

It is worth mentioning that, in practice, the internal preset threshold and the external preset threshold may be the same value or different values, which is not limited in this embodiment.

In the present embodiment, compared with the existing technologies, the first insulation resistance (i.e., the insulation resistance of the high voltage circuit on the side where the battery pack locates relative to the reference potential terminal) is obtained first. After it is determined that the first insulation resistance is normal, the second insulation resistance (i.e., the insulation resistance of the high voltage circuit on the side where the load locates relative to the reference potential terminal) may also be obtained, and the insulation state of the high voltage circuit on the side where the load locates is determined according to the second insulation resistance. This detection to both the first insulation resistance and the second insulation resistance is beneficial to avoiding insulation fault caused by failed insulativity of the high voltage circuit on the side where the load locates.

A second embodiment of the present disclosure relates to an insulation detection method. The second embodiment is substantially the same as the first embodiment, mainly different in that in the first embodiment, the second insulation resistance is obtained by closing any one of the main negative switch S3, the main positive switch S4, and the pre-charge switch S5, while in the present embodiment, at least any two of the main negative switch S3, the main positive switch S4, and the pre-charge switch S5 need to be closed to obtain the second insulation resistance. The method for obtaining the first insulation resistance in the first embodiment is applicable in the second embodiment.

Specifically, after determining that the first insulation resistance is normal, the present embodiment may first select a switch from the plurality of switches of the switch unit to be closed, and sample the voltage of the first sampling point A and the voltage of the second sampling point B when the current switch is closed. Then the present embodiment calculates a current third equivalent resistance according to the voltage of the first sampling point A, the voltage of the second sampling point B, the first equivalent resistance Rp, and the second equivalent resistance Rn, and the third equivalent resistance serves as the equivalent resistance of the high voltage circuit on the side where the current load locates relative to the reference potential terminal Vr.

Hereafter, the currently closed switch may be disconnected, and then another one of the plurality of switches may be reselected to be closed, and the voltages of the current first sampling point A and second sampling point B may be resampled. Then the current third equivalent resistance is recalculated according to the voltage of the first sampling point A, the voltage of the second sampling point B that are resampled, the first equivalent resistance Rp, and the second equivalent resistance Rn, until the number of the selected switches reaches a preset value that is greater than 1.

Finally, a fourth equivalent resistance and a fifth equivalent resistance are calculated according to the calculated third equivalent resistances, and the fourth equivalent resistance is an equivalent resistance of a first terminal of the load relative to the reference potential terminal Vr, and the fifth equivalent resistance is an equivalent resistance of the second terminal of the load relative to the reference potential terminal Vr. The less one of the fourth equivalent resistance and the fifth equivalent resistance is used as the second insulation resistance, wherein the first terminal of the load is a terminal connecting to the positive electrode of the battery pack, and the second terminal of the load is a terminal connecting to the negative electrode of the battery pack.

For example, the preset value is 2, that is, two switches in total need to be selected to be closed. It is assumed that the selected two switches are the main negative switch S3 and the main positive switch S4, respectively. The main negative switch S3 may be closed first. As can be seen from the first embodiment, when the main negative switch S3 is closed, the voltage value of the first sampling point A is $V1''$, and the voltage value of the second sampling point B is $V2''$. According to the above formula (3) and Rp, Rn and $V1''$, $V2''$, the equivalent resistance Rex of the high voltage circuit on the side where the load locates at the time relative to the reference potential terminal may calculated. That is, the current third equivalent resistance is Rex.

Hereafter, the main negative switch S3 may be disconnected and the main positive switch S4 may be closed. As can be seen from the first embodiment, when the main positive switch S4 is closed, the voltage value of the first sampling point A is $V1'''$, and the voltage value of the second sampling point B is $V2'''$. According to the above equation (4) and Rp, Rn and $V1'''$, $V2'''$, the equivalent resistance Rep of the high voltage circuit on the side where the current load locates relative to the reference potential terminal may be obtained. That is, the current third equivalent resistance is Rep.

Finally, according to Rex and Rep, the equivalent resistance Rp-ex (i.e., the fourth equivalent resistance) of the load's high voltage terminal relative to the reference potential terminal Vr and the equivalent resistance Rn-ex (i.e., the fifth equivalent resistance) of the load's low voltage terminal relative to the reference potential terminal Vr are calculated. Since Rex=(RL+Rp-ex)//Rn-ex, Rep=(RL+Rn-ex)//Rp-ex, the calculated Rex and Rep are put into the two equations to calculate Rp-ex and Rn-ex, after which the less one may be selected therefrom as the second insulation resistance, so as to evaluate the insulativity of the high voltage circuit on the side where the load locates.

In practice, the preset value may also be 3, and there may be three third equivalent resistances, Rex, Rep and Rep2. In this case, any two may be selected from among Rex, Rep, and Rep2 to calculate Rp-ex and Rn-ex; or two may be selected from among Rex, Rep, and Rep2 to calculate Rp-ex and Rn-ex once, and then two may be reselected (the latter two shall not be exactly the same as the former two) from among Rex, Rep, and Rep2 to calculate Rp-ex and Rn-ex once again. Finally, the average values of Rp-ex and Rn-ex calculated for the two times may be taken as Rp-ex and Rn-ex.

After Rp-ex and Rn-ex are obtained, the less one of Rp-ex and Rn-ex may be used as the second insulation resistance. Then the second insulation resistance may be compared with the external preset threshold (i.e., the insulation resistance value within the safe range of the high voltage circuit on the side where the load locates) to determine whether the second insulation resistance is normal. If the second insulation resistance is less than the external preset threshold, it indicates that the insulativity of the high voltage circuit on the side where the load locates does not meet the standards, and the second insulation resistance may be determined to be abnormal. If the second insulation resistance is not less than the external preset threshold, it indicates that the insulativity of the high voltage circuit on the side where the load locates meets the standards, when the second insulation resistance may be determined to be normal. After the second insulation resistance is determined to be normal, related actions may be performed on the driver.

In the present embodiment, compared with the existing technologies, the detection to both the first insulation resistance and the second insulation resistance is beneficial to avoiding insulation fault caused by failed insulativity of the high voltage circuit on the side where the load locates.

Those skilled in the art may understand that the above embodiments are specific embodiments for implementing the present disclosure, while in practice, various changes may be made in the form and details without departing from the scope of the present disclosure.

What is claimed is:

1. An insulation detection method, which is based on an insulation resistance detection circuit comprising a battery pack, a switch unit and a load;
   wherein a terminal of the load connects a positive electrode and a negative electrode of the battery pack respectively through the switch unit; the battery pack and the load being respectively connected on different sides of the switch unit;
   the circuit further comprises a controller, a first sampling point and a second sampling point;
   wherein the first sampling point is a connection point between the positive electrode of the battery pack and the switch unit, the second sampling point is a connection point between the switch unit and the negative electrode of the battery pack, and the controller respectively connecting the first sampling point and the second sampling point;
   the method comprising:
   calculating, when the switch unit is open, a first equivalent resistance and a second equivalent resistance; wherein the first equivalent resistance is an equivalent resistance of the positive electrode of the battery pack relative to a reference potential terminal, and the second equivalent resistance is an equivalent resistance of the negative electrode of the battery pack relative to the reference potential terminal;
   taking the less one of the first equivalent resistance and the second equivalent resistance as a first insulation resistance; wherein the first insulation resistance is an insulation resistance of a high voltage circuit on a side where the battery pack locates relative to the reference potential terminal;
   closing the switch unit when the first insulation resistance is normal, and calculating a second insulation resistance according to the first equivalent resistance, the second equivalent resistance, a voltage of the first sampling point and a voltage of the second sampling point when the switch unit is closed; wherein the second insulation resistance is an insulation resistance of a high voltage circuit on a side where the load locates relative to the reference potential terminal;
   determining an insulation state of the high voltage circuit on the side where the load locates according to the second insulation resistance.

2. The insulation detection method according to claim 1, wherein the switch unit comprises a plurality of switches; the plurality of switches comprise a main positive switch connecting between the positive electrode of the battery pack and the load, and a main negative switch connecting between the load and the negative electrode of the battery pack;
   the step of closing the switch unit, and calculating the second insulation resistance according to the first equivalent resistance, the second equivalent resistance, and the voltage of the first sampling point and the voltage of the second sampling point when the switch unit is closed, specifically comprises:
   closing any one of the plurality of switches, and calculating the second insulation resistance according to the first equivalent resistance, the second equivalent resistance, and the voltage of the first sampling point and the voltage of the second sampling point when the switch is closed.

3. The insulation detection method according to claim 1, wherein the switch unit comprises a plurality of switches; the plurality of switches comprise a main positive switch connecting between the positive electrode of the battery pack and the load, and a main negative switch connecting between the load and the negative electrode of the battery pack;
   the step of closing the switch unit, and calculating the second insulation resistance according to the first equivalent resistance, the second equivalent resistance, and the voltage of the first sampling point and the voltage of the second sampling point when the switch unit is closed, specifically comprises:
   selecting one of the plurality of switches to be closed, and calculating a current third equivalent resistance according to the first equivalent resistance, the second equivalent resistance, and the voltage of the first sampling point and the voltage of the second sampling point when the switch is closed; wherein the third equivalent resistance is an equivalent resistance of the high voltage circuit on the side where the load locates relative to the reference potential terminal;
   disconnecting the currently closed switch, reselecting another one of the plurality of switches to be closed, and recalculating a current third equivalent resistance until the number of the selected switches reaches a preset value; wherein the preset value is greater than 1;
   calculating a fourth equivalent resistance and a fifth equivalent resistance according to the third equivalent resistances; wherein the fourth equivalent resistance is an equivalent resistance of the first terminal of the load relative to the reference potential terminal, and the fifth equivalent resistance is an equivalent resistance of the second terminal of the load relative to the reference potential terminal; the first terminal of the load is a terminal connecting to the positive electrode of the battery pack, and the second terminal of the load is a terminal connecting to the negative electrode of the battery pack;
   taking the less one of the fourth equivalent resistance and the fifth equivalent resistance as the second insulation resistance.

4. The insulation detection method according to claim 2, wherein the plurality of switches further comprise a pre-charge switch connecting in series with a pre-charge resistance; and the pre-charge switch and the pre-charge resistance connect together between two terminals of the main positive switch.

5. The insulation detection method according to claim 1, wherein the circuit further comprises a control switch unit and a reference resistance unit on the same side where the battery pack locates, the reference resistance unit connects in series with the control switch unit, and the reference resistance and the control switch unit connect together between the positive and negative electrodes of the battery pack;

the step of calculating the first equivalent resistance and the second equivalent resistance, specifically comprises:

sampling the voltage of the first sampling point and the voltage of the second sampling point when the switch unit and the control switch unit are disconnected;

closing the control switch unit and resampling the voltage of the first sampling point and the voltage of the second sampling point;

calculating the first equivalent resistance and the second equivalent resistance according to the voltages of the first sampling point, the voltages of the second sampling point at two times, and the reference resistance unit in the circuit when the control switch unit is closed.

6. The insulation detection method according to claim 5, wherein the control switch unit comprises a first control switch module and a second control switch module, and the reference resistance unit comprises a first reference resistance module and a second reference resistance module;

the first reference resistance module connects the first switch module to form a first branch, and the second reference resistance module connects the second control switch module to form a second branch; one terminal of the first branch connects one terminal of the second branch, and the two terminals connect together to the reference potential terminal; the other terminal of the first branch connects the positive electrode of the battery pack, and the other terminal of the second branch connects the negative electrode of the battery pack;

the step of closing the control switch unit specifically comprising:

closing the first control switch module, if the sampled voltage of the first sampling point is greater than or equal to the sampled voltage of the second sampling point, in a state where the switch unit and the control switch unit are disconnected;

closing the second control switch module, if the sampled voltage of the first sampling point is less than the sampled voltage of the second sampling point, in a state where the switch unit and the control switch unit are disconnected.

7. The insulation detection method according to claim 1, wherein the step of determining the insulation state of the high voltage circuit on the side where the load locates according to the second insulation resistance, specifically comprises:

determining whether the second insulation resistance is less than an external preset threshold;

if yes, determining that the insulativity of the high voltage circuit on the side where the load locates fails to meet standards;

if no, determining that the insulativity of the high voltage circuit on the side where the load locates meet standards.

8. The insulation detection method according to claim 7, further comprising: transmitting an insulation alert when it is determined that the insulativity of the high voltage circuit on the side where the load locates fails to meet the standards.

\* \* \* \* \*